United States Patent
Kim

(10) Patent No.: US 11,444,096 B2
(45) Date of Patent: Sep. 13, 2022

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Jin Ha Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 226 days.

(21) Appl. No.: 16/847,251

(22) Filed: Apr. 13, 2020

(65) Prior Publication Data

US 2021/0151456 A1    May 20, 2021

(30) Foreign Application Priority Data

Nov. 15, 2019  (KR) .................. 10-2019-0146502

(51) Int. Cl.
| | | |
|---|---|---|
| *H01L 27/11582* | (2017.01) | |
| *H01L 27/11548* | (2017.01) | |
| *H01L 27/11575* | (2017.01) | |
| *H01L 27/11573* | (2017.01) | |
| *H01L 27/11556* | (2017.01) | |
| *H01L 27/11526* | (2017.01) | |
| *H01L 23/528* | (2006.01) | |

(52) U.S. Cl.
CPC ...... *H01L 27/11573* (2013.01); *H01L 23/528* (2013.01); *H01L 27/11526* (2013.01); *H01L 27/11548* (2013.01); *H01L 27/11556* (2013.01); *H01L 27/11575* (2013.01); *H01L 27/11582* (2013.01)

(58) Field of Classification Search
CPC ............ H01L 27/11573; H01L 23/528; H01L 27/11526; H01L 27/11548; H01L 27/11556; H01L 27/11575; H01L 27/11582; H01L 23/5225; H01L 27/11521; H01L 23/552; H01L 27/11551; H01L 27/11568; H01L 27/11578; H01L 27/2436; H01L 27/2481; H01L 21/76816; H01L 21/76829; H01L 21/76846; H01L 21/76895; H01L 21/76897
See application file for complete search history.

(56) References Cited

U.S. PATENT DOCUMENTS 8,288,816 B2    10/2012   Komori et al.
9,721,663 B1 *   8/2017   Ogawa ............... H01L 23/5226

FOREIGN PATENT DOCUMENTS

KR     1020100095723 A    9/2010

* cited by examiner

*Primary Examiner* — David Vu
(74) *Attorney, Agent, or Firm* — William Park & Associates Ltd.

(57) ABSTRACT

A semiconductor device includes a cell array including a source structure, a peripheral circuit, an interconnection structure located between the cell array and the peripheral circuit and electrically coupled to the peripheral circuit, and a decoupling structure configured to prevent a coupling capacitor that occurs between the cell array and the interconnection structure.

18 Claims, 15 Drawing Sheets

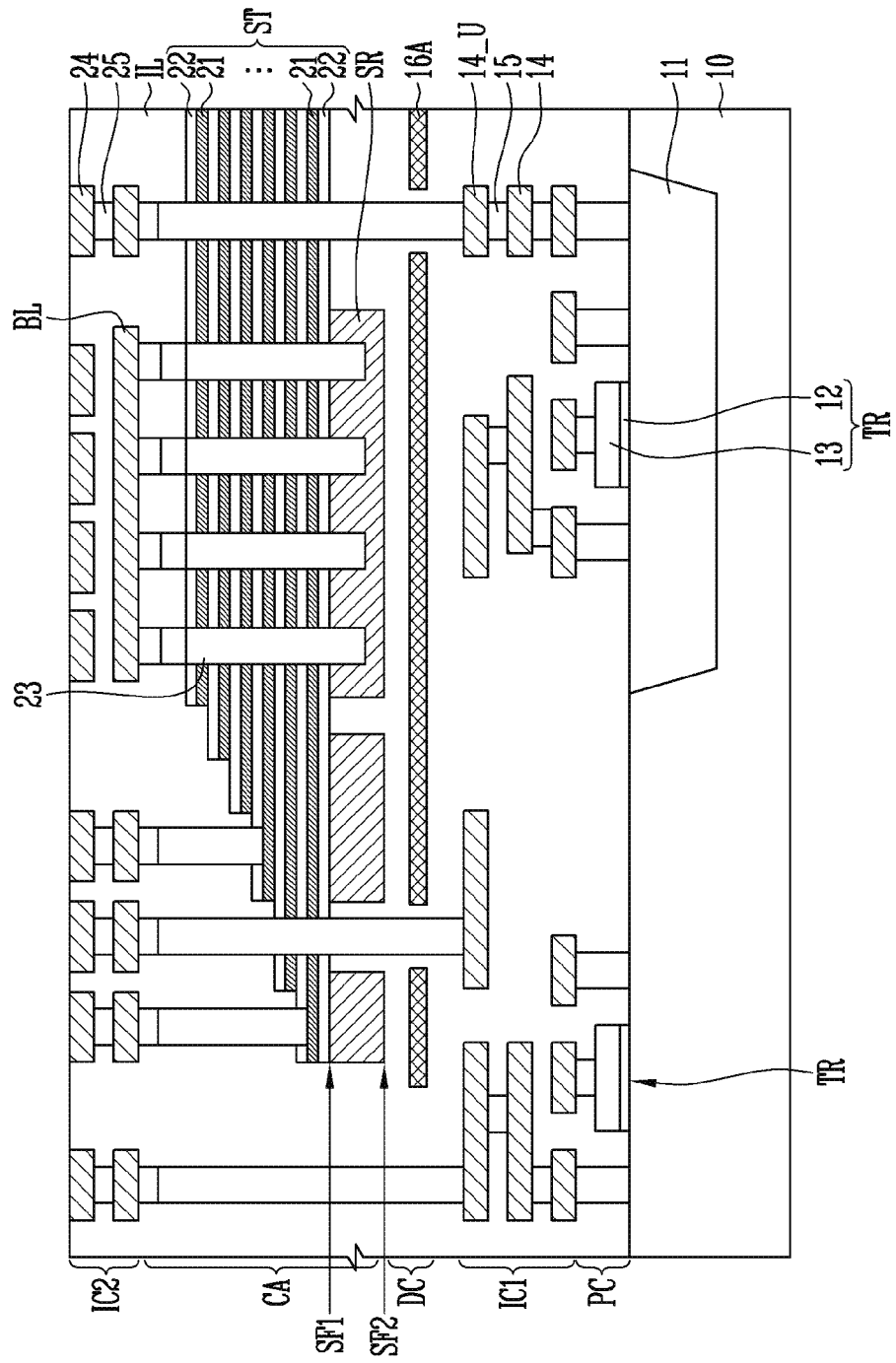

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2019-0146502 filed on Nov. 15, 2019, in the Korean Intellectual Property Office, the entire disclosure of which is incorporated herein by reference.

BACKGROUND

1. Technical Field

Various embodiments relate generally to an electronic device, and more particularly, to a semiconductor device and a manufacturing method thereof.

2. Related Art

Non-volatile memory devices retain stored data regardless of whether power is on or off. Increasing the integration density of two-dimensional non-volatile memory devices, forming memory cells in a single layer over a substrate, has been difficult. Thus, three-dimensional non-volatile memory devices have been proposed in which memory cells are stacked in a vertical direction over a substrate.

A three-dimensional non-volatile memory device may include interlayer insulating layers and gate electrodes that are stacked, alternating between each other, and channel layers passing therethrough, with memory cells stacked along the channel layers. Various structures and manufacturing methods have been developed to improve the operational reliability of three-dimensional non-volatile memory devices.

SUMMARY

According to an embodiment, a semiconductor device may include a cell array including a source structure, a peripheral circuit, an interconnection structure located between the cell array and the peripheral circuit and electrically coupled to the peripheral circuit, and a decoupling structure located between the cell array and the interconnection structure and having an electrically floating state.

According to an embodiment, a semiconductor device may include a source structure including a first surface and a second surface, the second surface being on an opposite side of the first surface, a cell stacked structure that is located on the first surface of the source structure, a first interconnection structure that is located on the second surface of the source structure, and a decoupling structure located between the source structure and the first interconnection structure and having a mesh shape.

According to an embodiment, a method of manufacturing a semiconductor device may include forming a peripheral circuit, forming a first interconnection structure that is electrically coupled to the peripheral circuit, forming a decoupling structure having an electrically floating state on the first interconnection structure, and forming a cell array on the decoupling structure.

According to an embodiment, a method of manufacturing a semiconductor device may include forming a peripheral circuit, forming a first interconnection structure electrically coupled to the peripheral circuit, forming a decoupling structure having a mesh shape on the first interconnection structure, and forming a cell array on the decoupling structure.

BRIEF DESCRIPTION OF THE DRAWINGS

FIGS. 1A to 1C are diagrams, illustrating the structure of a semiconductor device, according to an embodiment of the present disclosure;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments of the present disclosure provide a semiconductor device having a stabilized structure and improved characteristics, and a manufacturing method thereof.

Figure 1B:
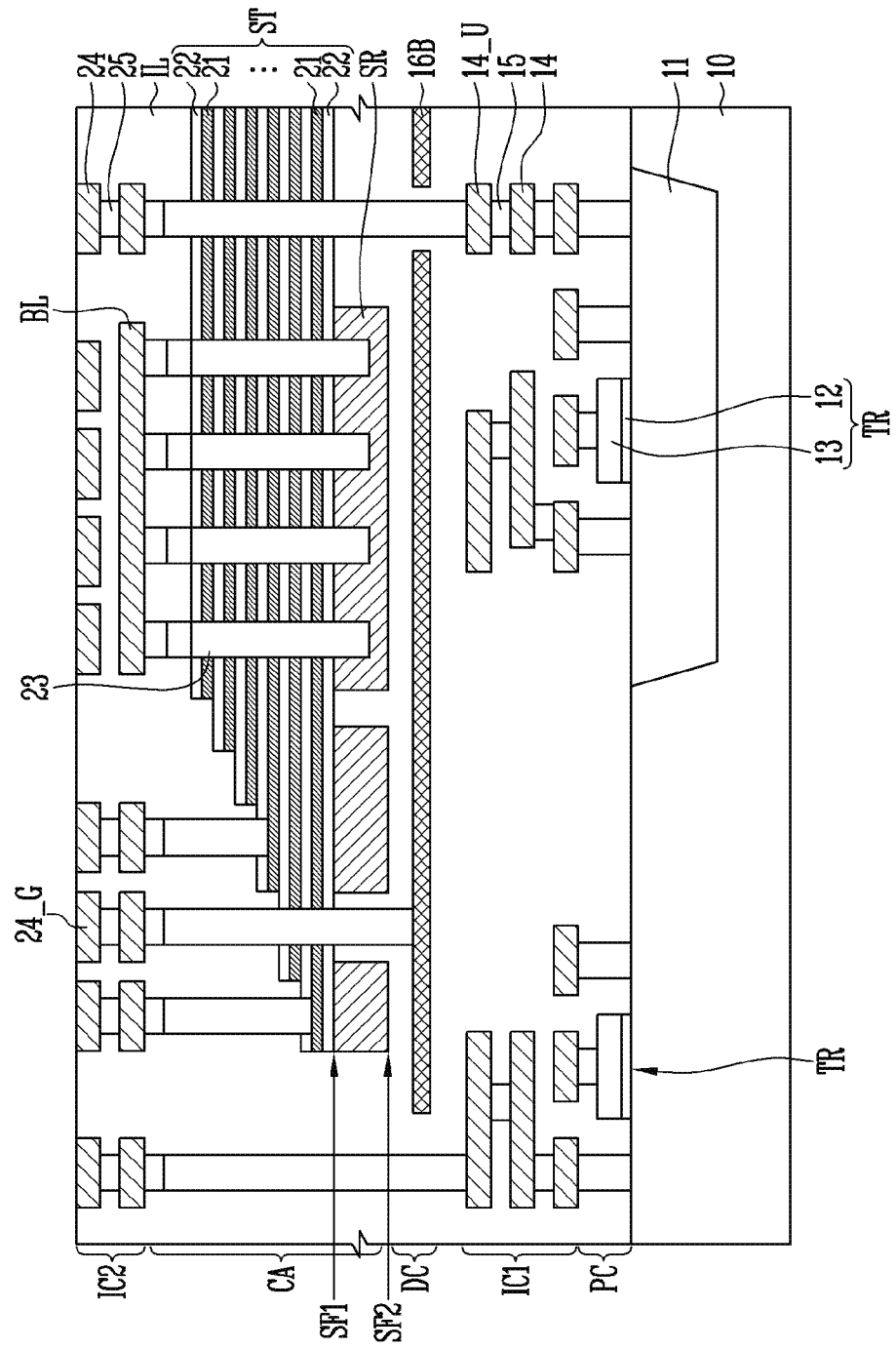
Figure 1C:
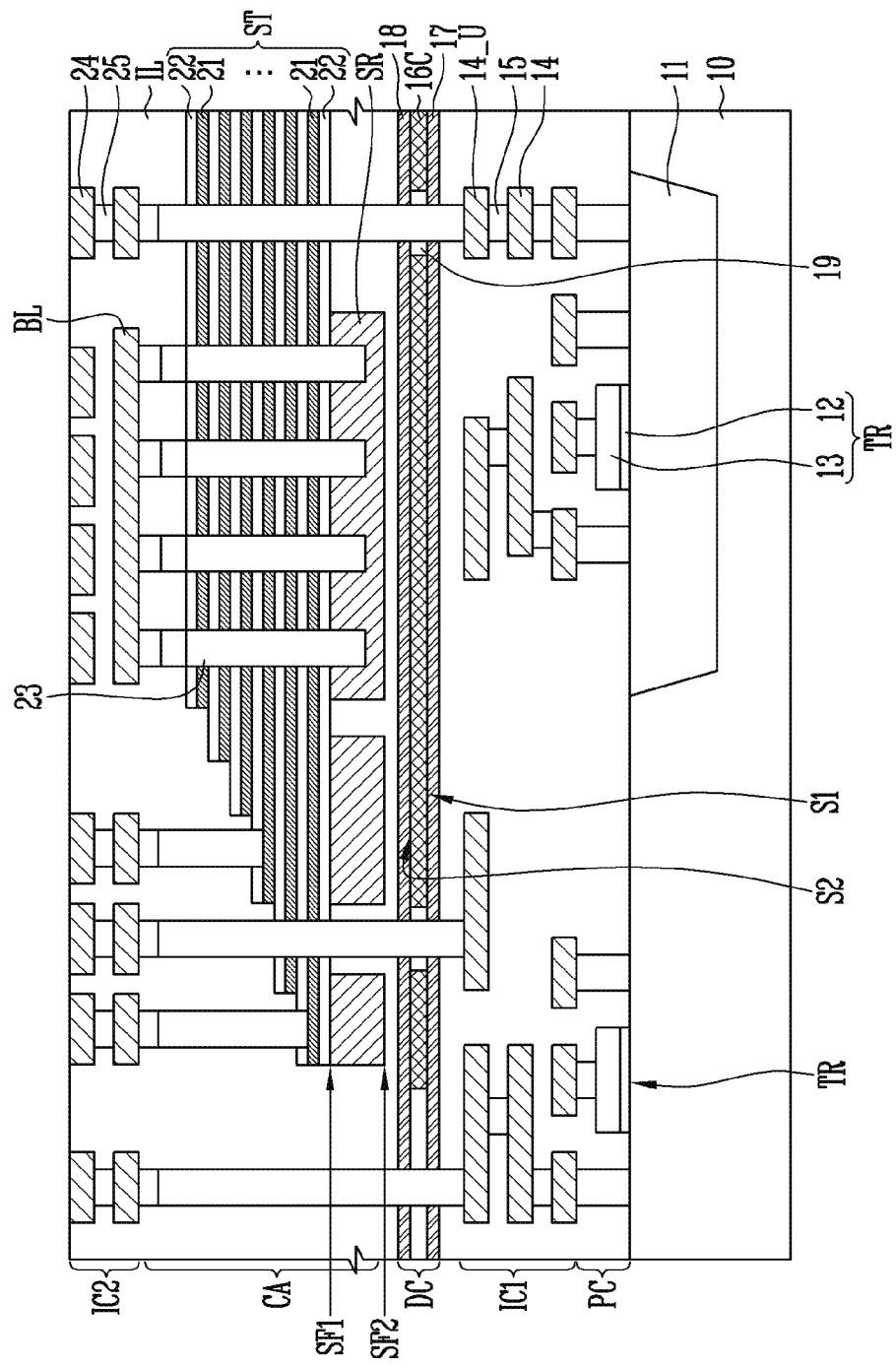

FIGS. 1A to 1C are diagrams illustrating the structure of a semiconductor device according to an embodiment of the present disclosure.

Referring to FIGS. 1A to 1C, a semiconductor device may include a cell array CA, a first interconnection structure IC1, and a decoupling structure DC. In addition, the semiconductor device may further include at least one of a substrate 10, a peripheral circuit PC, a second interconnection structure IC2, and an interlayer insulating layer IL.

The cell array CA may include memory cells that store data. The cell array CA may include a source line, a bit line BL, and a memory string, all of which being coupled between the source line and the bit line BL. The source line may be a source structure SR. The source structure SR may be a substrate that includes an impurity region or a conductive layer formed in a single layer or a plurality of layers. The bit line BL may be metal wiring. The source structure SR may include a first surface SF1 and a second surface SF2, the second surface SF2 being on the opposing side of the first surface SF1.

A stacked structure ST may be located between the source structure SR and the bit line BL. The stacked structure ST may be located on the first surface SF1 of the source structure SR. The stacked structure ST may be a cell structure with a plurality of memory cells.

The stacked structure ST may include conductive layers 21 and insulating layers 22 that are stacked in an alternating manner. A channel structure 23 may pass through the stacked structure ST. The channel structure 23 may include a channel layer and a data storage layer that are interposed between the channel layer and the conductive layers 21. The channel layer may be coupled between the source structure SR and the bit line BL. The data storage layer may include a floating gate, a charge trapping material, polysilicon, a nitride, a nanostructure, a variable resistance material, and a phase change material. The channel layer may have a tubular shape and may include a gap-filling insulating layer.

Memory cells or select transistors may be located at interconnections between the conductive layers 21 and the channel structure 23. Therefore, at least one drain select transistor, a plurality of memory cells, and at least one source select transistor may be stacked along the channel structure 23. In addition, at least one drain select transistor, a plurality of memory cells, and at least one source select transistor, which share the channel structure 23, may form a single memory string. The connection between the source structure SR and the memory string may be controlled by the source select transistor. The connection between the bit line BL and the memory string may be controlled by the drain select transistor.

The peripheral circuit PC may include a circuit that drives the cell array CA. The peripheral circuit PC may include a transistor TR, a capacitor, a register, a voltage generator, a reference voltage generation circuit, and the like. The transistor TR may be located on the substrate 10. The transistor TR may include a gate insulating layer 12 and a gate electrode 13. An impurity region 11 may be formed in the substrate 10. The impurity region 11 may have a triple well structure that may include an N type well, a P type well, and the like.

The peripheral circuit PC may be located at a different level compared to the cell array CA. The peripheral circuit PC may be located above or below the cell array CA.

The first interconnection structure IC1 may be electrically coupled to the peripheral circuit PC. The first interconnection structure IC1 may include contact plugs 15, wires 14, and so on. The first interconnection structure IC1 may be located between the cell array CA and the peripheral circuit PC. The first interconnection structure IC1 may be located between the source structure SR and the peripheral circuit PC. The first interconnection structure IC1 may be located on the second surface SF2 of the source structure SR.

The wires 14 may be arranged in a plurality of layers. Specifically, the wires 14, located in a plurality of different layers, may be electrically coupled to each other through the contact plugs 15. At least one of the wires 14 may be formed to provide a reference voltage and may be coupled to the reference voltage generation circuit. For example, a wire 14_U, located at an uppermost level, may be coupled to the reference voltage generation circuit.

The second interconnection structure IC2 may be electrically coupled to the cell array CA and may include contact plugs 25 and wires 24. The second interconnection structure IC2 may be located above the cell array CA. The stacked structure ST may be located between the second interconnection structure IC2 and the first interconnection structure IC1.

The wires 24 may be arranged in a plurality of layers. Specifically, the wires 24, located in a plurality of different layers, may be electrically coupled to each other through the contact plugs 25. At least one of the contact plugs 25 may be electrically coupled to the conductive layer 21. One of the contact plugs 25 may pass through the stacked structure ST and the decoupling structure DC in order to be electrically coupled to the first interconnection structure IC1.

The decoupling structure DC may be provided to block the electrical interference between neighboring structures. For example, the decoupling structure DC may prevent a coupling capacitor between adjacent structures. The decoupling structure DC may include a conductive material. Specifically, the decoupling structure DC may include polysilicon or a metal such as tungsten. In addition, the decoupling structure DC may include a plurality of conductive patterns to achieve structural flexibility and to effectively block a coupling capacitor. The shape of the decoupling structure DC will be described below with reference to FIGS. 2A to 2D.

The decoupling structure DC may be located between the cell array CA and the peripheral circuit PC. The decoupling structure DC may also be located between the source structure SR and the first interconnection structure IC1. The decoupling structure DC may be located on the second surface SF2 of the source structure SR. The decoupling structure DC may prevent a coupling capacitor between the source structure SR and the first interconnection structure IC1.

When a memory operation (such as a program operation, a read operation, or an erase operation) is performed, the voltage applied to the source structure SR may vary. In addition, due to the coupling capacitor between the source structure SR and the first interconnection structure IC1, the voltage of the first interconnection structure IC1 may vary. For example, the voltage of the wire that supplies the reference voltage, among the wires 14 that are included in the first interconnection structure IC1, may vary. As a result, the voltage level of the reference voltage that is applied to a circuit may vary.

These voltages variations may be worse when the wire that supplies the reference voltage is located closest to the source structure SR. When the wire that supplies the reference voltage is the uppermost wire 14_U, there may be greater electrical interference based on the voltage variations of the source structure SR. In addition, the internal voltage that is necessary for a memory operation might not be output as a constant value, resulting in the semiconductor device operating erroneously or reliability of the semiconductor device deteriorating. Therefore, by placing the decoupling structure DC between the source structure SR and the first interconnection structure IC1, the coupling capacitor between the source structure SR and the uppermost wire 14_U may be prevented.

According to an embodiment, the decoupling structure DC may have an electrically floating state. Referring to FIG.

1A, the decoupling structure DC may include conductive patterns 16A, and the conductive patterns 16A may be formed in the interlayer insulating layer IL. Therefore, the conductive patterns 16A may be electrically insulated from neighboring structures due to the interlayer insulating layer IL. The decoupling structure DC may be electrically insulated from the source structure SR, the bit line BL, and the first interconnection structure IC1. In addition, the decoupling structure DC may be electrically insulated from the second interconnection structure IC2. The floated decoupling structure DC may have less voltage variations than the source structure SR so that the voltage level of the first interconnection structure IC1, particularly, the voltage level of the uppermost wire 14_U may be stably maintained.

According to an embodiment, the decoupling structure DC may be coupled to a ground line. Referring to FIG. 1B, the decoupling structure DC may include conductive patterns 16B, and the second interconnection structure IC2 may include a ground line 24_G. In addition, the conductive patterns 16B may be electrically coupled to the ground line 24_G, and a ground voltage may be applied to the conductive patterns 16B through the ground line 24_G. Therefore, the decoupling structure DC may maintain the ground voltage regardless of the voltage variations of the source structure SR, and the voltage level of the uppermost wire 14_U may be more stably maintained. In other embodiments, the first interconnection structure IC1 may include the ground line. According to an embodiment, the semiconductor device may further include a barrier layer. Referring to FIG. 1C, a semiconductor device may further include a first barrier layer 17 that is located between the conductive patterns 16C and the first interconnection structure IC1. The semiconductor device may further include a second barrier layer 18 that is located between the conductive patterns 16C and the source structure SR. The semiconductor device may further include both the first barrier layer 17 and the second barrier layer 18.

The first barrier layer 17 may be an etch stop layer used during manufacturing processes. The first barrier layer 17 may include a material with a higher etch selectivity compared to the interlayer insulating layer IL. The interlayer insulating layer IL may include an oxide and the first barrier layer 17 may include a nitride.

The second barrier layer 18 may be a protective layer used to protect the decoupling structure DC during manufacturing processes. When the decoupling structure DC includes a metal such as tungsten and the interlayer insulating layer IL includes an oxide, the decoupling structure DC may be oxidized or damaged due to its contact with the interlayer insulating layer IL. Therefore, by interposing the second barrier layer 18 between the conductive patterns 16C and the interlayer insulating layer IL, the oxidation or damage of the decoupling structure DC may be prevented. The second barrier layer 18 may include a material without oxygen atoms. Instead, the second barrier layer 18 may include a nitride.

The decoupling structure DC may include conductive patterns 16C. Insulating layers 19 may fill in between the conductive patterns 16C. Each of the conductive patterns 16C may include a first surface S1 and a second surface S2, the second surface S2 being on the opposite side of the first surface S1. The first surface S1 may face to the first interconnection structure IC1, and the second surface S2 may face to the source structure SR. The first barrier layer 17 may be in contact with the first surface S1, and the second barrier layer 18 may be in contact with the second surface S2.

According to the above-described structure, the electrical interference between neighboring structures may be prevented by the decoupling structure DC. The decoupling structure DC may prevent a coupling capacitor between the source structure SR and the first interconnection structure IC1. By electrically floating the decoupling structure DC or applying a ground voltage to the decoupling structure DC, the electrical interference may be shielded more efficiently. Therefore, the decoupling structure DC may prevent an erroneous operation or may prevent unreliability.

FIGS. 2A to 2D are diagrams, illustrating the structure of a semiconductor device, according to an embodiment of the present disclosure. The shape of the decoupling structure DC is described with reference to FIGS. 2A to 2D.

Referring to FIGS. 2A to 2D, according to an embodiment, the decoupling structure DC may have a mesh shape. The decoupling structure DC may be formed by patterning a conductive layer or by using a damascene process.

The decoupling structure DC may include first conductive patterns P1 and second conductive patterns P2, the second conductive pattern P2 crossing the first conductive patterns P1. The first conductive patterns P1 may be arranged in a first direction I. The first conductive patterns P1 may be arranged to be spaced apart by substantially the same distance or by different distances. The first conductive patterns P1 may extend, in parallel, in a second direction II, crossing the first direction I. The second conductive patterns P2 may be arranged in the second direction II. The second conductive patterns P2 may be arranged to be spaced apart by substantially the same distance or by different distances. The second conductive patterns P2 may extend, in parallel, in the first direction I, crossing the second direction II.

The decoupling structure DC may include openings OP1 that are formed within the mesh shape, between the first conductive patterns P1 and the second conductive patterns P2. The openings OP1 may be arranged in the first direction I and the second direction II. The insulating layers 19 may be formed in the openings OP. The insulating layers 19 may be a mold used to form the decoupling structure DC.

For reference, as shown in FIGS. 1A to 1C, the second interconnection structure IC2 may include contact plugs that pass through the decoupling structure DC in order to be electrically coupled to the first interconnection structure IC1. The contact plugs may be located at positions that correspond to the openings OP1 of the decoupling structure DC. In other words, the contact plugs may be electrically coupled to the first interconnection structure IC1 through at least one of the opening OP1.

Figure 2A:
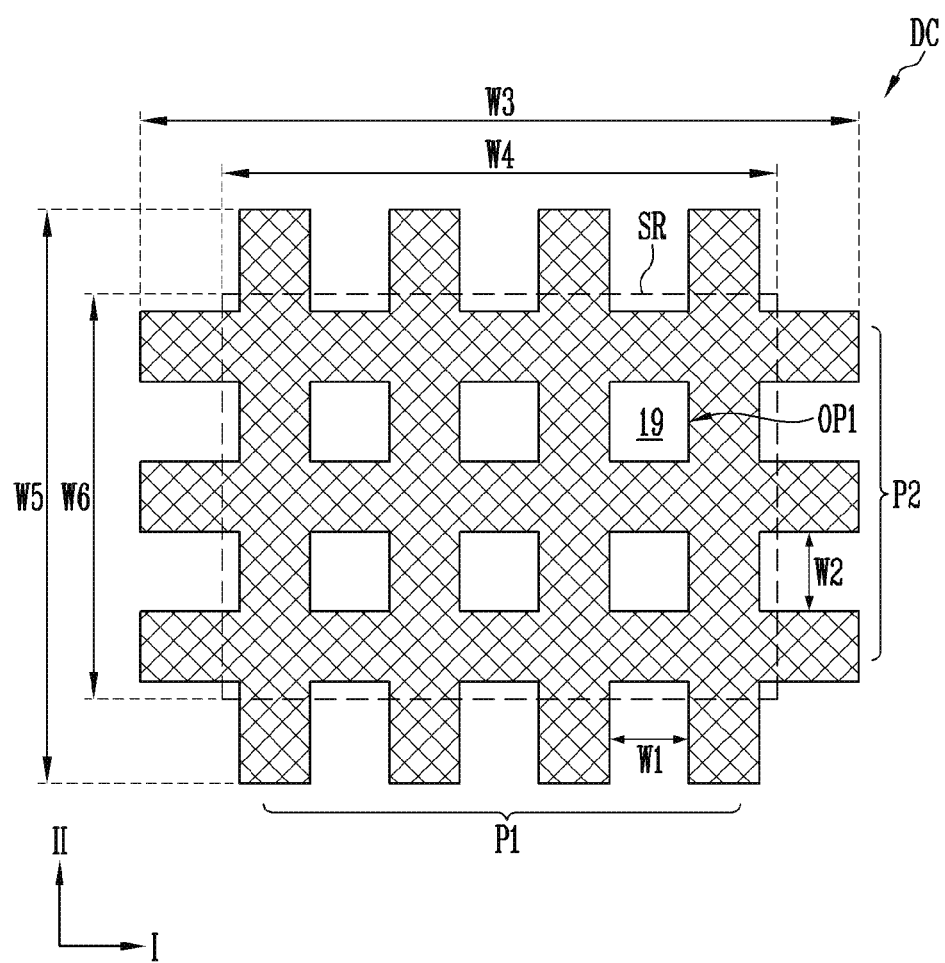
FIGS. 2A to 2D are diagrams, illustrating the structure of a semiconductor device, according to an embodiment of the present disclosure.

Referring to FIG. 2A, the first conductive patterns P1 may be spaced apart by a first distance W1 in the first direction I. The second conductive patterns P2 may be spaced apart by a second distance W2 in the second direction II. The first distance W1 and the second distance W2 may be substantially the same. Each of the openings OP1 may have a square cross-section.

In addition, the decoupling structure DC may have a greater cross-sectional area than that of the source structure SR. The area that is covered by the decoupling structure DC, including the openings OP1, may be greater than that of the source structure SR. For example, the width W3 of the decoupling structure DC, in the first direction I, may be greater than the width W4 of the source structure SR in the first direction I. In addition, the width W5 of the decoupling structure DC, in the second direction II, may be greater than the width W6 of the source structure SR in the second direction II.

Figure 2B:
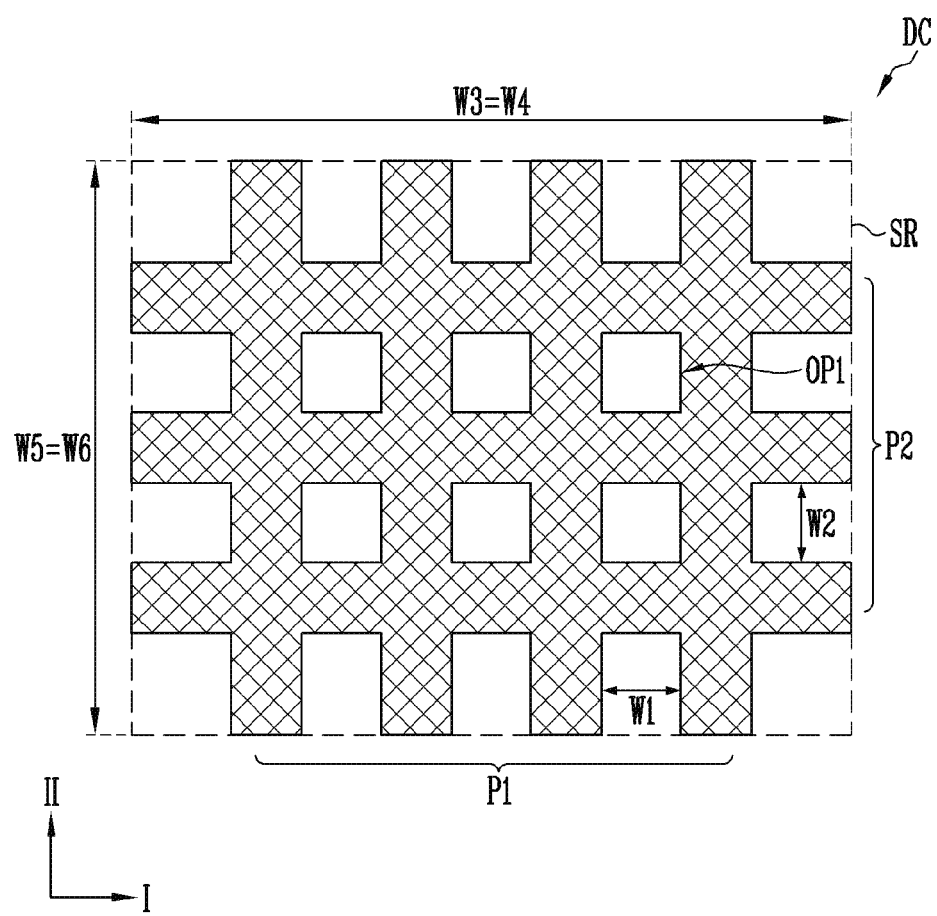

Referring to FIG. 2B, the decoupling structure DC may have substantially the same area as that of the source structure SR. The area that is covered by the decoupling structure DC, including the openings OP1, may be substantially the same as that of the source structure SR. For example, the width W3 of the decoupling structure DC, in the first direction I, may be substantially the same as the width W4 of the source structure SR in the first direction I. In addition, the width W5 of the decoupling structure DC, in the second direction II, may be greater than the width W6 of the source structure SR in the second direction II.

Figure 2C:
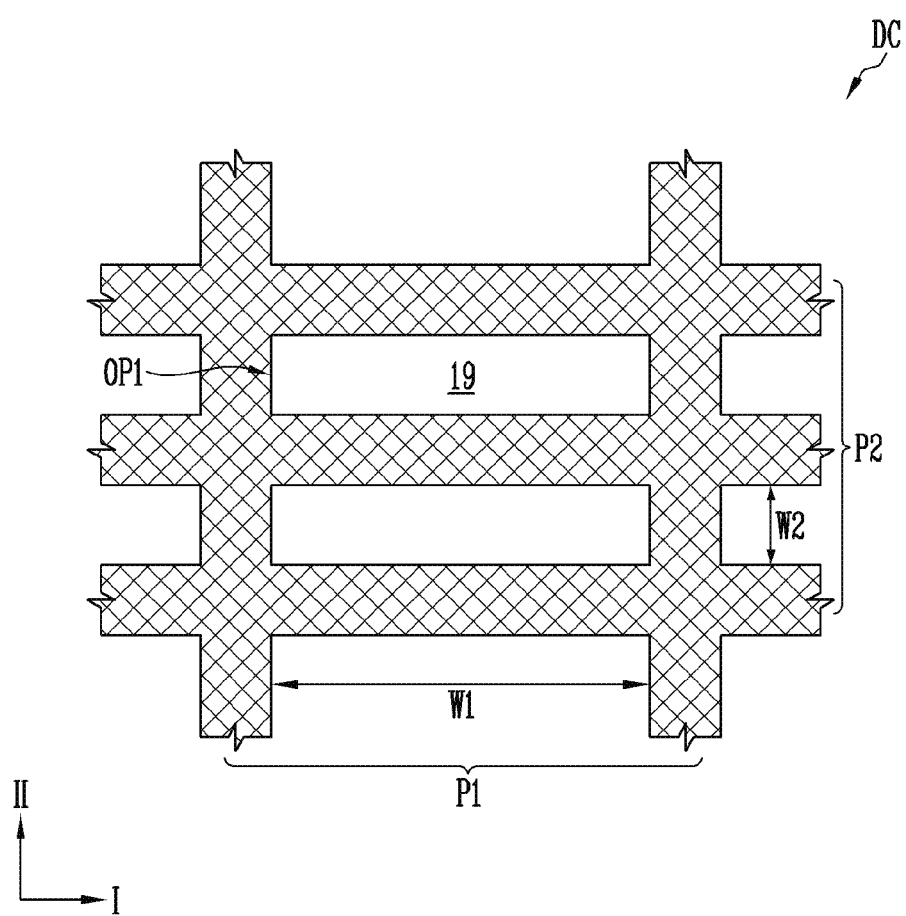

Referring to FIG. 2C, in the decoupling structure DC, the first distance W1, between the first conductive patterns P1, may be greater than the second distance W2 that is between the second conductive patterns P2. Each of the openings OP1 may have a rectangular cross-section with the length in the first direction I greater than the length in the second direction II.

Figure 2D:
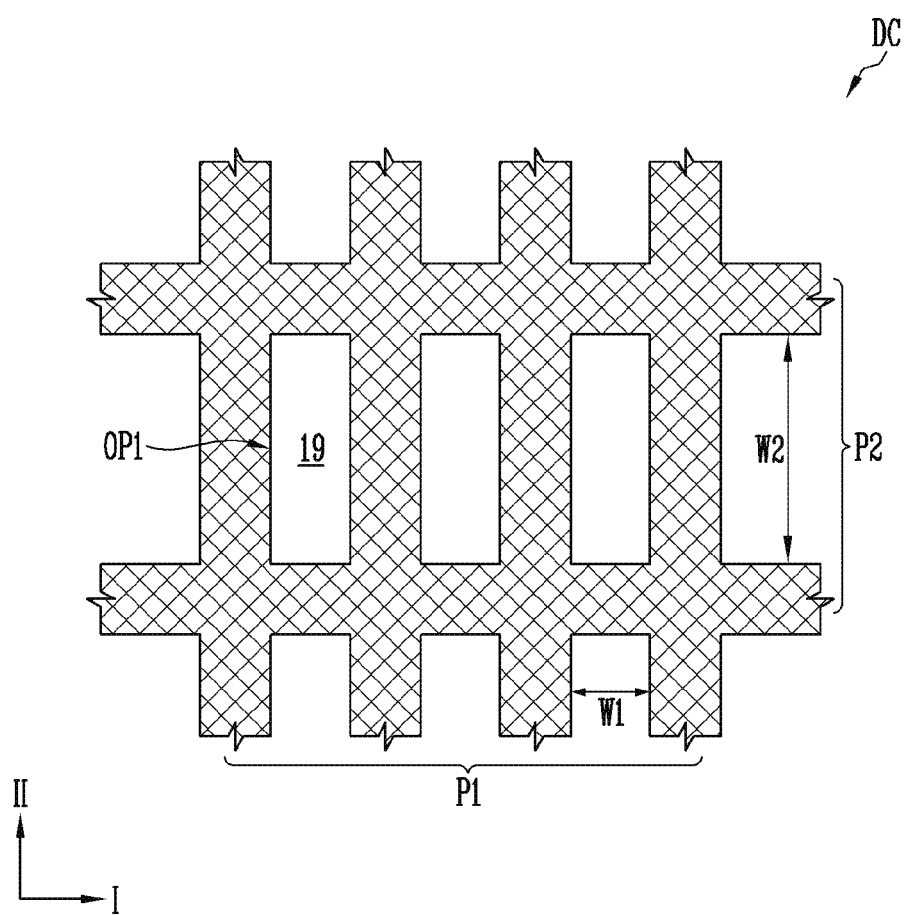

Referring to FIG. 2D, in the decoupling structure DC, the second distance W2, between the second conductive patterns P2, may be greater than the first distance W1 that is between the first conductive patterns P1. Each of the openings OP1 may have a rectangular cross-section with the length in the second direction II greater than the length in the first direction I.

According to the above-described structures, the decoupling structure DC may have a mesh shape. The mesh shape of the decoupling structure DC, which includes the openings OP1, may be structurally flexible in comparison to the plate shape that is free from the openings OP1. Therefore, even when a chip is bent, the decoupling structure DC may avoid damaged or detachment.

Since the decoupling structure DC has the mesh shape, the decoupling structure DC may cover a greater area that corresponds to the source structure SR. Therefore, regardless of the shape of the first interconnection structure IC1, as shown in FIGS. 1A to 1C, a coupling capacitor may be prevented. For example, regardless of the arrangement of the uppermost wire or the direction in which it extends, the coupling capacitor between the source structure SR and the uppermost wire 14_U may be prevented. In addition, the mesh shape of the decoupling structure DC may be changed to various forms. The mesh shape may be optimized by considering the arrangement, shape, and area of the source structure SR, the first interconnection structure IC1, and the uppermost wire 14_U.

FIGS. 3A to 3F are diagrams, illustrating a method of manufacturing a semiconductor device, according to an embodiment of the present disclosure. In the following description, description of certain elements that are discussed above is omitted for the sake of brevity.

Figure 3A:
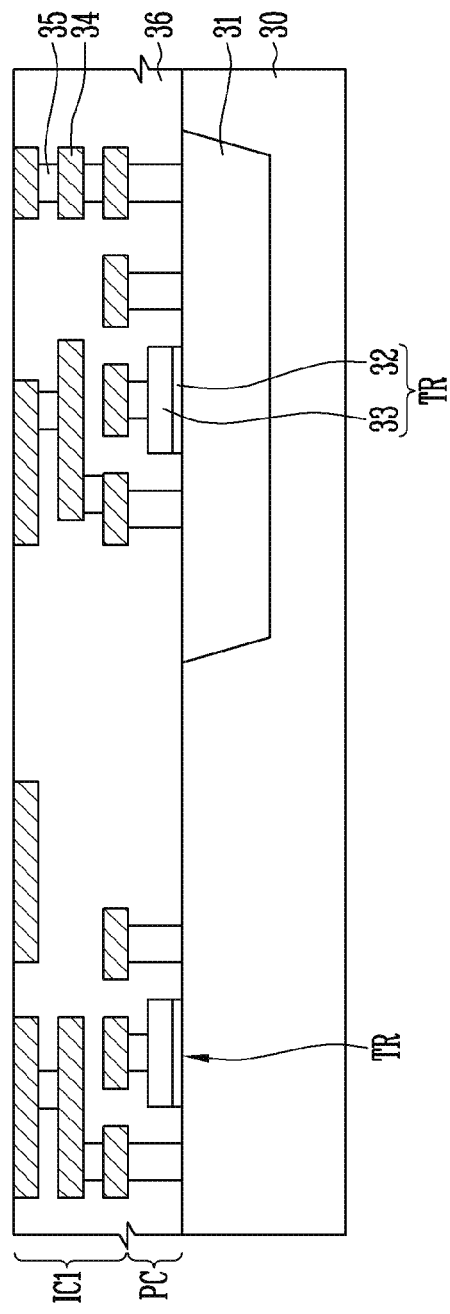
FIGS. 3A to 3F are diagrams, illustrating a method of manufacturing a semiconductor device, according to an embodiment of the present disclosure.

Referring to FIG. 3A, the peripheral circuit PC, the first interconnection structure IC1, and the first interlayer insulating layer 36 may be formed over the substrate 30. The substrate 30 may include the impurity region 31. The peripheral circuit PC may be formed on the substrate 30. The peripheral circuit PC may include the transistor TR. The transistor TR may include a gate insulating layer 32 and a gate electrode 33. The first interconnection structure IC1 may be electrically coupled to the peripheral circuit PC. The first interconnection structure IC1 may include wires 34 and contact plugs 35.

The peripheral circuit PC and the first interconnection structure IC1 may be formed in the first interlayer insulating layer 36. The first interlayer insulating layer 36 may include an insulating material such as an oxide or a nitride. The first interlayer insulating layer 36 may be a single layer or a plurality of layers.

Figure 3B:
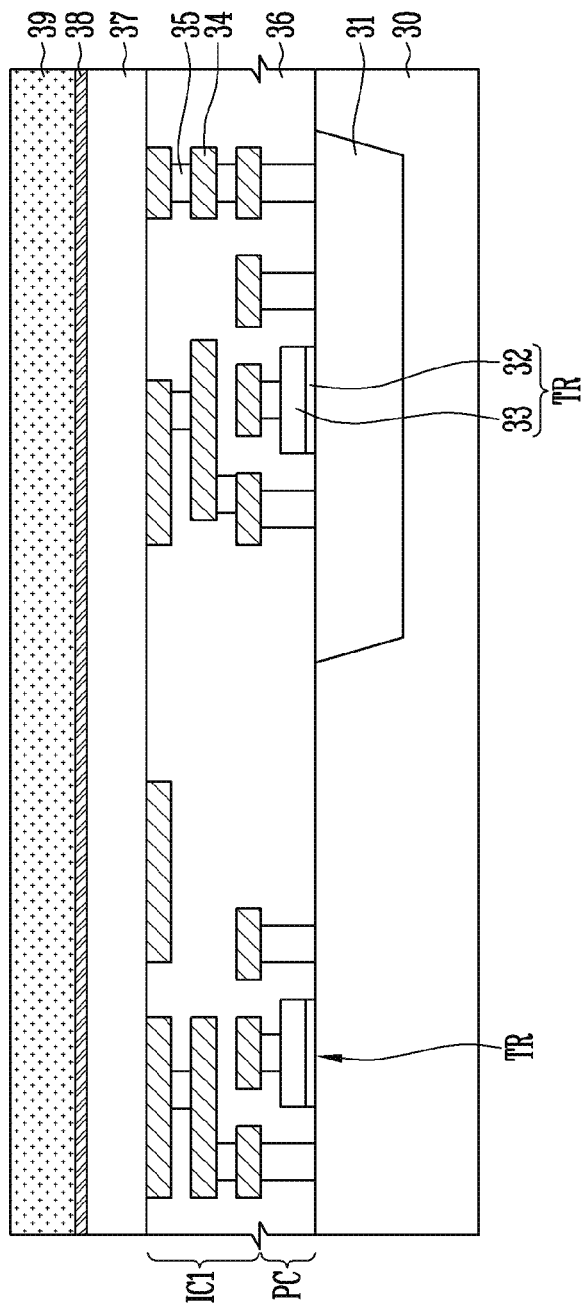
Figure 3C:
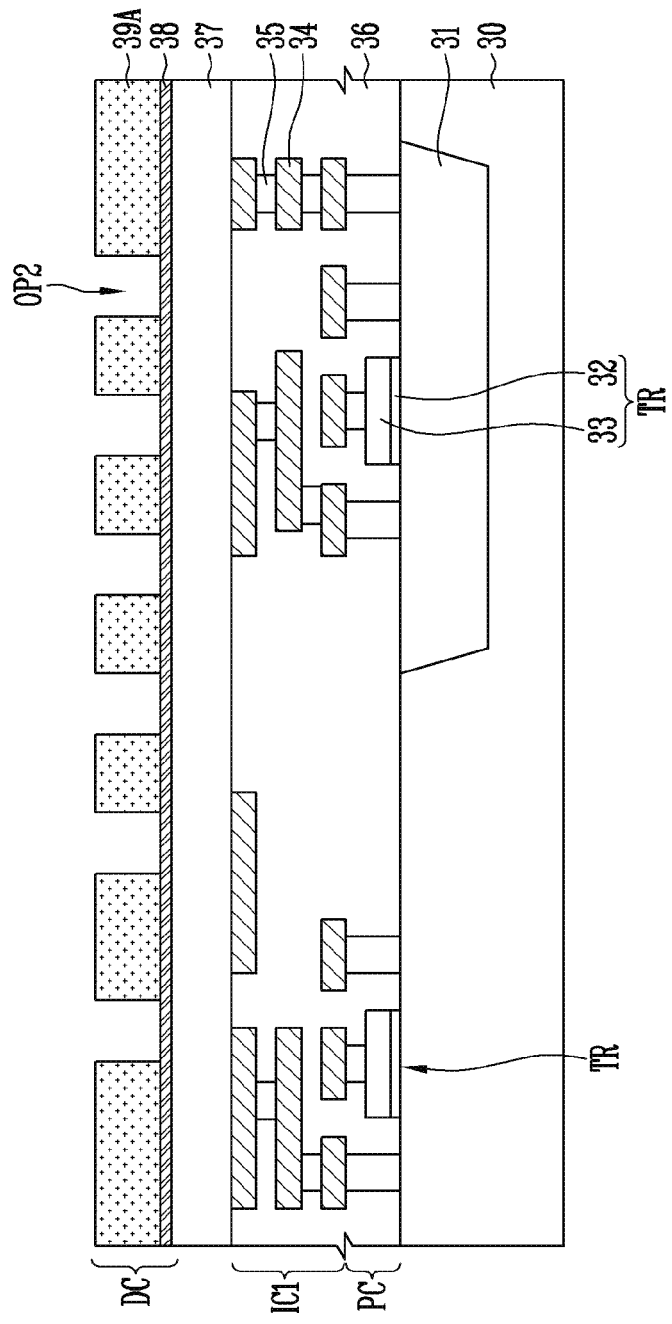
Figure 3D:
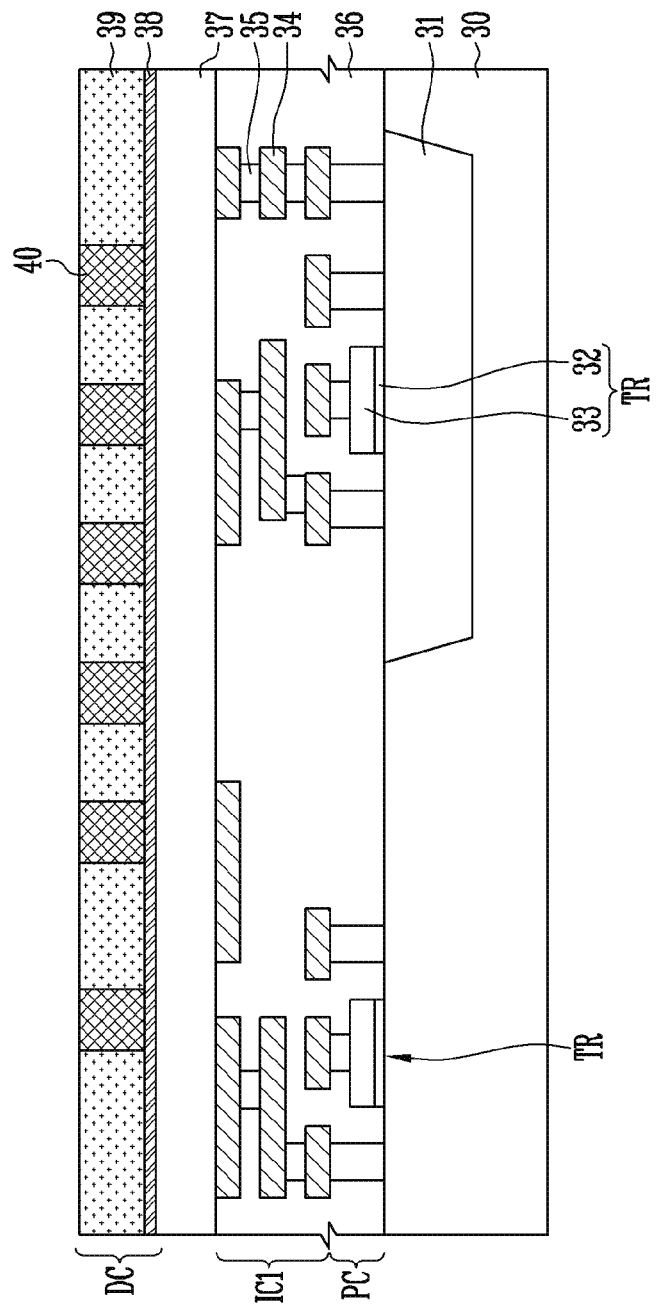

Referring to FIGS. 3B to 3D, the decoupling structure DC may be formed on the first interlayer insulating layer 36. The decoupling structure DC may be formed by patterning a conductive layer or by using a damascene process. According to the embodiment, a method of forming the decoupling structure DC with the damascene process is described.

First, referring to FIG. 3B, the second interlayer insulating layer 37 may be formed on the first interlayer insulating layer 36. The second interlayer insulating layer 37 may include an insulating material such as an oxide. A first barrier layer 38 may be formed on the second interlayer insulating layer 37, and an insulating material 39 may be formed on the first barrier layer 38. The first barrier layer 38 may include a material having a higher etch selectivity compared to the insulating material 39. The first barrier layer 38 may include a nitride, and the insulating material 39 may include an oxide.

Referring to FIG. 3C, an insulating layer 39A may be formed by patterning the insulating material 39. The insulating layer 39A may be a mold for forming a decoupling structure. For example, after a mask pattern (not shown) is formed on the insulating material 39, the insulating material 39 may be etched using the mask pattern as an etch barrier. When the insulating material 39 is etched, the first barrier layer 38 may serve as an etch stop layer. As a result, the insulating layer 39A, including the opening OP2, may be formed, and the opening OP2 may be within the mesh shape.

Referring to FIG. 3D, a conductive layer 40 may be formed in the opening OP2. For example, after a conductive material is formed to fill the opening OP2, the conductive material may be planarized to form the conductive layer 40. The conductive layer 40 may include polysilicon or a metal such as tungsten.

The conductive layer 40 may have a shape that corresponds to the opening OP2. The conductive layer 40 may have a mesh shape. For example, the conductive layer 40 may include first conductive patterns and second patterns crossing the first conductive patterns. The conductive material of the conductive layer 40 may be formed using a deposition process, and a planarizing process may be performed using a chemical mechanical polishing (CMP) process. Accordingly, the decoupling structure DC and the conductive layer 40 may be formed.

Figure 3E:
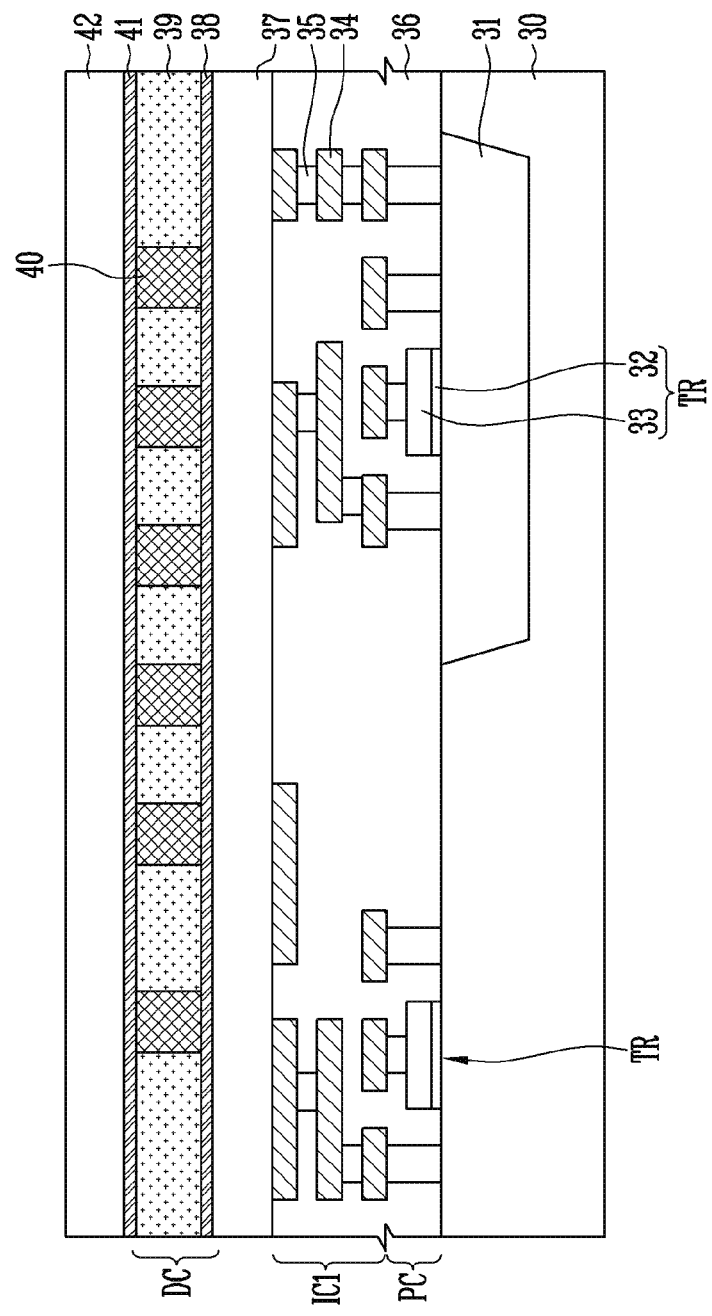

Referring to FIG. 3E, a second barrier layer 41 may be formed on the decoupling structure DC. The second barrier layer 41 may be a protective layer that protects the conductive layer 40 during subsequent processes. To prevent oxidation of the decoupling structure DC, the second barrier layer 41 might not include oxygen atoms. Instead, the second barrier layer 41 may include a nitride.

A second interlayer insulating layer 42 may be formed on the second barrier layer 41. The second interlayer insulating layer 42 may include an insulating material such as an oxide and a nitride. After an insulating material is deposited on the second barrier layer 41, the insulating material may be planarized to form a second interlayer insulating layer 42.

Figure 3F:
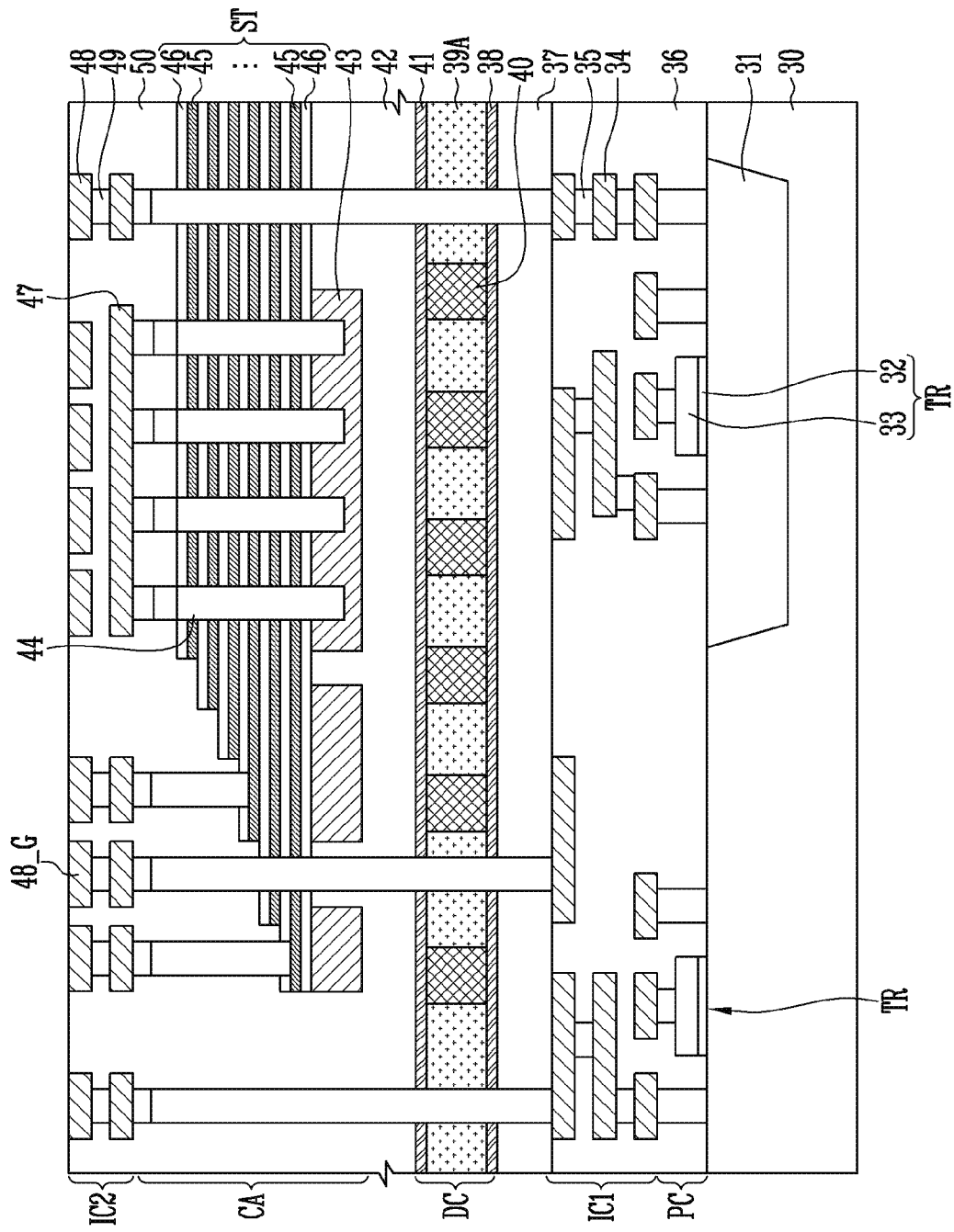

Referring to FIG. 3F, the cell array CA, the second interconnection structure IC2, and a third interlayer insulating layer 50 may be formed on the second interlayer insulating layer 42. The cell array CA may include a source structure 43, the stacked structure ST, a channel structure 44 and a bit line 47. The stacked structure ST may include conductive layers 45 and insulating layers 46 that are stacked, alternating between each other. The second interconnection structure IC2 may be electrically coupled to the cell array CA. The second interconnection structure IC2 may include wires 48 and contact plugs 49.

The cell array CA and the second interconnection structure IC2 may be formed in the third interlayer insulating layer 50. The third interlayer insulating layer 50 may include an insulating material such as an oxide or a nitride. The third interlayer insulating layer 50 may be a single layer or a plurality of layers.

At least a portion of the wires 48 and the contact plugs 49 that are included in the second interconnection structure IC2 may pass through the decoupling structure DC in order to be electrically coupled to the first interconnection structure IC1. At least a portion of the wires 48 and the contact plugs 49 may be electrically coupled to the decoupling structure DC. For example, a ground line 48_G may be electrically coupled to the decoupling structure DC.

According to the above-described manufacturing method, the decoupling structure DC with a mesh shape may be formed. In addition, the shape of the decoupling structure DC may different based on the shape of the mold.

Figure 4:
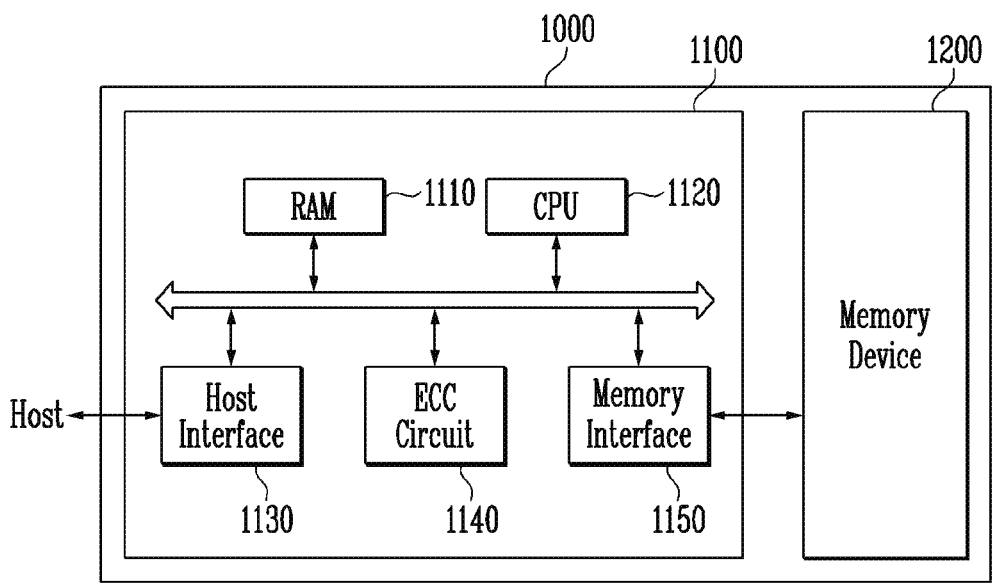
FIG. 4 is a block diagram, illustrating the configuration of a memory system, according to an embodiment of the present disclosure.

FIG. 4 is a block diagram, illustrating the configuration of a memory system 1000, according to an embodiment of the present disclosure.

As illustrated in FIG. 4, the memory system 1000, according to an embodiment, may include a memory device 1200 and a controller 1100.

The memory device 1200 may be used to store various types of data such as text, graphics, and software codes. The memory device 1200 may be a non-volatile memory device. In addition, the memory device 1200 may have the structure described above with reference to FIGS. 1A to 3F, and may be manufactured by the manufacturing method described above with reference to FIGS. 1A to 3F. According to an embodiment, the memory device 1200 may include a cell array including a source structure, a peripheral circuit, an interconnection structure located between the cell array and the peripheral circuit and electrically coupled to the peripheral circuit, and a decoupling structure located between the cell array and the interconnection structure and having an electrically floating state. Since the memory device 1200 is configured and manufactured in the same manner as described above, a detailed description thereof will be omitted.

The controller 1100 may be coupled to a host and the memory device 1200 and may be configured to access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may serve as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), or the like.

The CPU 1120 may control the overall operation of the controller 1100. For example, the CPU 1120 may operate firmware such as a flash translation layer (FTL) stored in the RAM 1110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

For reference, the controller 1100 may further include a buffer memory (not shown) to temporarily store data. The buffer memory may be used to temporarily store data to be transferred from the host interface 1130 to an external device, or data to be transferred from the memory interface 1150 to the memory device 1200. In addition, the controller 1100 may further include a ROM that stores code data to interface with the host.

Since the memory system 1000 according to the embodiment includes the memory device 1200 having improved integration density and characteristics, the memory system 1000 may also have improved integration density and characteristics accordingly.

Figure 5:
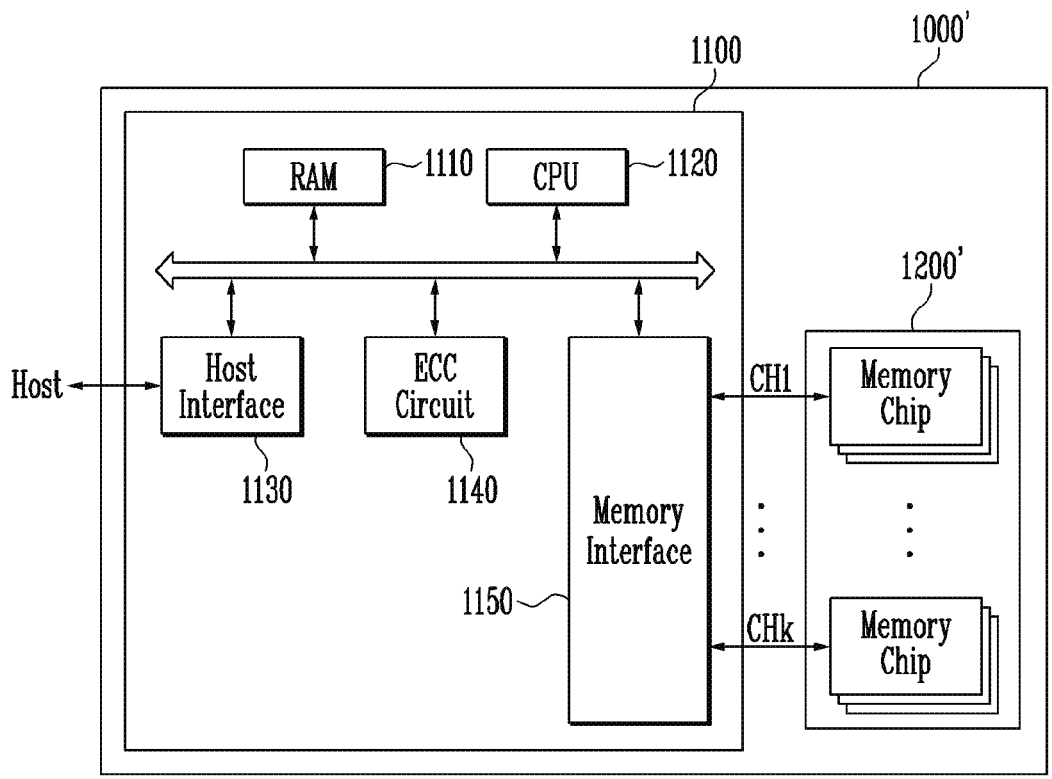
FIG. 5 is a block diagram, illustrating the configuration of a memory system, according to an embodiment of the present disclosure.

FIG. 5 is a block diagram, illustrating a memory system 1000', according to an embodiment. In the following description, description of certain elements that are discussed above is omitted for the sake of brevity.

Referring to FIG. 5, the memory system 1000', according to the embodiment, may include a memory device 1200' and a controller 1100. The controller 1100 may include a RAM 1110, a CPU 1120, a host interface 1130, an ECC circuit 1140 and a memory interface 1150.

The memory device 1200' may be a non-volatile memory device. In addition, the memory device 1200' may have the structure described above with reference to FIGS. 1A to 3F, and may be manufactured by the manufacturing method described above with reference to FIGS. 1A to 3F. According to an embodiment, the memory device 1200' may include a cell array including a source structure, a peripheral circuit, an interconnection structure located between the cell array and the peripheral circuit and electrically coupled to the peripheral circuit, and a decoupling structure located between the cell array and the interconnection structure and having an electrically floating state. Since the memory device 1200' is configured and manufactured in the same manner as described above, a detailed description thereof will be omitted.

Furthermore, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips, included in a single group, may be suitable to communicate with the controller 1100 through a common channel. For reference, the memory system 1000' may be modified such that each memory chip may be coupled to a corresponding single channel.

As described above, since the memory system 1000' according to the embodiment includes the memory device 1200' having improved integration and characteristics, the integration density and characteristics of the memory system 1000' may also be improved. In particular, since the memory device 1200' is formed into a multi-chip package, data storage capacity and operating speed of the memory system 1000' may be enhanced.

Figure 6:
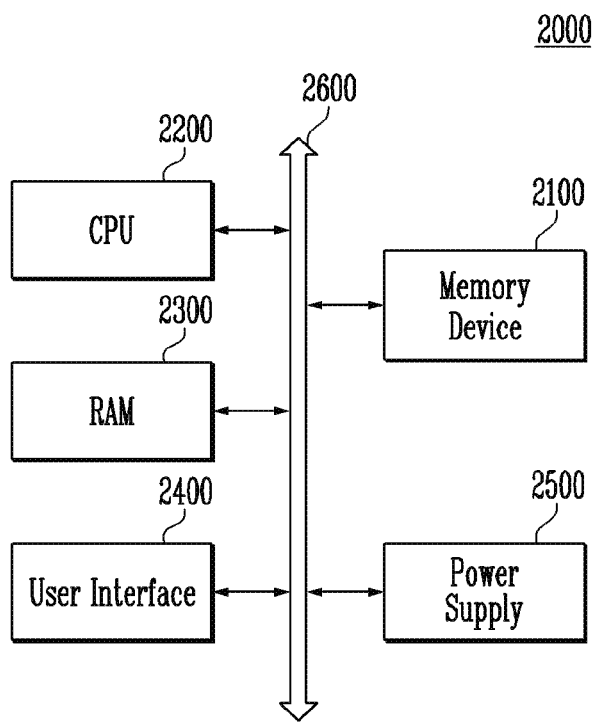
FIG. 6 is a block diagram, illustrating the configuration of a computing system, according to an embodiment of the present disclosure.

FIG. 6 is a block diagram, illustrating the configuration of a computing system 2000, according to an embodiment. Hereinafter, any repetitive detailed description of components already mentioned above will be omitted.

As illustrated in FIG. 6, the computing system 2000 may include a memory device 2100, a CPU 2200, a random-access memory (RAM) 2300, a user interface 2400, a power supply 2500 and a system bus 2600.

The memory device 2100 may store data provided via the user interface 2400, data processed by the CPU 2200, etc. The memory device 2100 may be electrically coupled to the CPU 2200, the RAM 2300, the user interface 2400, and the power supply 2500 by the system bus 2600. For example, the memory device 2100 may be coupled to the system bus 2600 via a controller (not shown), or directly to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may have the structure described above with reference to FIGS. 1A to 3F, and may be manufactured by the manufacturing method described above with reference to FIGS. 1A to 3F. According to an embodiment, the memory device 2100 may include a cell array including a source structure, a peripheral circuit, an interconnection structure located between the cell array and the peripheral circuit and electrically coupled to the peripheral circuit, and a decoupling structure located between the cell array and the interconnection structure and having an electrically floating state. Since the memory device 2100 is configured and manufactured in the same manner as described above, a detailed description thereof will be omitted.

In addition, as described above with reference to FIG. 5, the memory device 2100 may be a multi-chip package composed of a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices to form a home network, one of various electronic devices to form a computer network, one of various electronic devices to form a telematics network, an RFID device, or the like.

As described above, since the computing system 2000 according to the embodiment includes the memory device 2100 having improved integration and characteristics, the characteristics of the computing system 2000 may also be improved.

Figure 7:
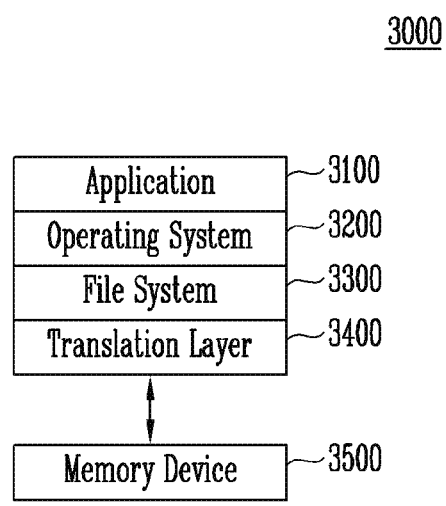
FIG. 7 is a block diagram, illustrating a computing system, according to an embodiment of the present disclosure.

FIG. 7 is a block diagram, illustrating a computing system 3000, according to an embodiment.

As illustrated in FIG. 7, the computing system 3000 according to an embodiment may include a software layer that has an operating system 3200, an application 3100, a file system 3300, and a translation layer 3400. The computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 used in the computing system 3000. For example, when the operating system 3200 is a Microsoft Windows-based system, the file system 3300 may be a file allocation table (FAT) or an NT file system (NTFS). In addition, the operating system 3200 is a Unix/Linux system, the file system 3300 may be an extended file system (EXT), a Unix file system (UFS), a journaling file system (JFS), or the like.

FIG. 7 illustrates the operating system 3200, the application 3100, and the file system 3300 in separate blocks. However, the application 3100 and the file system 3300 may be included in the operating system 3200.

The translation layer 3400 may translate an address into a suitable form for the memory device 3500 in response to a request from the file system 3300. For example, the translation layer 3400 may translate a logic address, generated by the file system 3300, into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a non-volatile memory. In addition, the memory device 3500 may have the structure described above with reference to FIGS. 1A to 3F, and may be manufactured by the fabricating method described above with reference to FIGS. 1A to 3F. According to an embodiment, the memory device 3500 may include a cell array including a source structure, a peripheral circuit, an interconnection structure located between the cell array and the peripheral circuit and electrically coupled to the peripheral circuit, and a decoupling structure located between the cell array and the interconnection structure and having an electrically floating state. Since the memory device 3500 is configured and manufactured in the same manner as described above, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the embodiment includes the memory device 3500 having improved integration density and characteristics, characteristics of the computing system 3000 may also be improved.

In accordance with various embodiments of the invention, a semiconductor device having a stabilized structure and improved reliability may be provided. In addition, a method of manufacturing a semiconductor device may be more simplified with lower manufacturing costs.

It will be apparent to those skilled in the art that various modifications can be made to any of the above-described embodiments of the present invention without departing from the spirit or scope of the invention. Thus, it is intended that the present invention cover all such modifications provided they come within the scope of the appended claims and their equivalents.

What is claimed is:

1. A semiconductor device, comprising:
   a cell array including a source structure;
   a peripheral circuit;
   an interconnection structure located between the cell array and the peripheral circuit and electrically coupled to the peripheral circuit; and
   a decoupling structure located between the cell array and the interconnection structure and having an electrically floating state.

2. The semiconductor device of claim 1, wherein the decoupling structure has a mesh shape.

3. The semiconductor device of claim 1, wherein the decoupling structure comprises:
   first conductive patterns; and
   second conductive patterns crossing the first conductive patterns.

4. The semiconductor device of claim 1, further comprising an interlayer insulating layer that is interposed between the cell array and the interconnection structure,
   wherein the decoupling structure is formed in the interlayer insulating layer.

5. The semiconductor device of claim 1, wherein the decoupling structure is electrically separated from the cell array and the interconnection structure.

6. The semiconductor device of claim 1, wherein the interconnection structure includes wires that are coupled to a reference voltage generation circuit.

7. The semiconductor device of claim 6, wherein the decoupling structure prevents a coupling capacitor between the source structure and the wires.

8. The semiconductor device of claim 1, wherein the cell array further includes a bit line and a memory string, and
   wherein the decoupling structure prevents a coupling capacitor between the source structure and the interconnection structure.

9. A semiconductor device, comprising:
   a source structure including a first surface and a second surface, the second surface being on an opposite side of the first surface;
   a cell stacked structure that is located on the first surface of the source structure;
   a first interconnection structure that is located on the second surface of the source structure; and
   a decoupling structure located between the source structure and the first interconnection structure and having a mesh shape.

10. The semiconductor device of claim 9, wherein the decoupling structure has an electrically floating state.

11. The semiconductor device of claim 9, wherein the first interconnection structure includes wires that are coupled to a reference voltage generation circuit.

12. The semiconductor device of claim 11, wherein the decoupling structure prevents a coupling capacitor between the source structure and the wires.

13. The semiconductor device of claim 9, further comprising a ground line applying a ground voltage to the decoupling structure.

14. The semiconductor device of claim 9, wherein the decoupling structure comprises:
    first conductive patterns; and
    second conductive patterns crossing the first conductive patterns.

15. The semiconductor device of claim 9, wherein the decoupling structure includes openings arranged in a first direction and a second direction, the second direction crossing the first direction.

16. The semiconductor device of claim 15, further comprising a second interconnection structure that is located on the first surface of the source structure,
    wherein the second interconnection structure includes a contact plug that is electrically coupled to the first interconnection structure through at least one of the openings.

17. The semiconductor device of claim 9, further comprising a barrier layer contacting the decoupling structure.

18. The semiconductor device of claim 9, wherein the decoupling structure includes a first surface facing the first interconnection structure and a second surface facing the source structure, and
    the decoupling structure further comprises a first barrier layer contacting the first surface and a second barrier layer contacting the second surface.

* * * * *